United States Patent
Lee et al.

(10) Patent No.: US 8,980,986 B2
(45) Date of Patent: Mar. 17, 2015

(54) REFLECTIVE BODY AND A LIGHT-EMITTING DEVICE EQUIPPED WITH THE SAME

(75) Inventors: Youn Eung Lee, Daejeon (KR); Jin Kyu Lee, Busan (KR); Young Taek Oh, Seoul (KR)

(73) Assignee: Shenzhen Wote Advanced Materials Co., Ltd., Shenzhen (CN)

( * ) Notice: Subject to any disclaimer, the term of this patent is extended or adjusted under 35 U.S.C. 154(b) by 0 days.

(21) Appl. No.: 13/883,725

(22) PCT Filed: Sep. 29, 2011

(86) PCT No.: PCT/KR2011/007170
§ 371 (c)(1),
(2), (4) Date: May 6, 2013

(87) PCT Pub. No.: WO2012/064019
PCT Pub. Date: May 18, 2012

(65) Prior Publication Data
US 2013/0231436 A1   Sep. 5, 2013

(30) Foreign Application Priority Data

Nov. 12, 2010 (KR) .......... 10-2012-0112994

(51) Int. Cl.
*B60C 1/00* (2006.01)
*H01L 33/60* (2010.01)
*C08G 63/06* (2006.01)
*C08K 7/14* (2006.01)
*C08K 3/22* (2006.01)

(52) U.S. Cl.
CPC .............. *H01L 33/60* (2013.01); *C08G 63/065* (2013.01); *C08K 7/14* (2013.01); *C08K 2003/2237* (2013.01); *C08K 2201/003* (2013.01); *C08K 2201/004* (2013.01)
USPC .......................................................... 524/492

(58) Field of Classification Search
USPC ......................................................... 524/492
See application file for complete search history.

(56) References Cited

U.S. PATENT DOCUMENTS

| 5,529,716 A * | 6/1996 | Nomura et al. ........ 252/299.01 |
| 7,713,439 B2 * | 5/2010 | Murouchi et al. ...... 252/299.01 |
| 2009/0250662 A1 | 10/2009 | Murouchi et al. |
| 2010/0053972 A1 | 3/2010 | Nakayama |

FOREIGN PATENT DOCUMENTS

KR    10-2006-0052093    5/2006

OTHER PUBLICATIONS

International Search Report—PCT/KR2011/007170 dated May 1, 2012.
Written Opinion—PCT/KR2011/007170 dated May 1, 2012.

* cited by examiner

*Primary Examiner* — Ling Choi
*Assistant Examiner* — Thuy-Ai Nguyen
(74) *Attorney, Agent, or Firm* — Osha Liang LLP

(57) ABSTRACT

A reflector and a light-emitting device including the same. The reflector includes a wholly aromatic liquid crystalline polyester resin compound that includes a repeating unit derived from a hydroxybenzoic acid and a repeating unit derived from a hydroxynaphthoic acid, but does not include a repeating unit derived from an aromatic dicarboxylic acid, wherein the wholly aromatic liquid crystalline polyester resin compound further includes a white inorganic filler.

7 Claims, 2 Drawing Sheets

REFLECTIVE BODY AND A LIGHT-EMITTING DEVICE EQUIPPED WITH THE SAME

TECHNICAL FIELD

The present invention relates to a reflector and a light-emitting device including the same, and more particularly, to a reflector including a wholly aromatic liquid crystalline polyester resin compound that includes a repeating unit derived from a hydroxybenzoic acid and a repeating unit derived from a hydroxynaphthoic acid, but does not include a repeating unit derived from an aromatic dicarboxylic acid, and a light-emitting device including the reflector.

BACKGROUND ART

Polyamide-based resins that are efficiently used in injection molding have been widely used to manufacture reflectors, such as a reflector for a light emitting diode (LED). However, polyamide-based resins discolor in a light-emitting device, such as an LED, which operates at a high voltage, when exposed to light and heat for a long period of time. Thus, the polyamide-based resins may not properly function as a reflector, may deteriorate the emission capability of light-emitting devices, and may reduce a lifespan thereof.

A wholly aromatic liquid crystalline polyester resin (LCP) is drawing attention as a new material for reflectors has high thermal resistance and micromolding thereof may be possible. However, conventional wholly aromatic liquid crystalline polyester resin cannot form an injection-molded product that has a dense structure, so that cracks may often occur in the surface of the product, and provides less initial reflectance than the polyimide-based resins. In particular, reflectance rapidly decreases in the initial stage of reliability evaluation. If the wholly aromatic liquid crystalline polyester resin is used in a reflector of a light-emitting body used in an internal or external light or a backlight unit for a TV which should be stable against light and heat for a long period of time, the brightness or saturation of a screen may become unstable.

DISCLOSURE OF INVENTION

Technical Problem

The present invention provides a reflector including a wholly aromatic liquid crystalline polyester resin compound that includes a repeating unit derived from a hydroxybenzoic acid and a repeating unit derived from a hydroxynaphthoic acid, but does not include a repeating unit derived from an aromatic dicarboxylic acid.

The present invention also provides a light-emitting device including the reflector.

Solution to Problem

According to an aspect of the present invention, there is provided a reflector including: a wholly aromatic liquid crystalline polyester resin compound that includes a repeating unit derived from a hydroxybenzoic acid, and a repeating unit derived from a hydroxynaphthoic acid, but does not include a repeating unit derived from an aromatic dicarboxylic acid, wherein the wholly aromatic liquid crystalline polyester resin compound further includes a white inorganic filler.

The hydroxybenzoic acid may include one selected from the group consisting of p-hydroxybenzoic acid, 3-hydroxybenzoic acid, 2-hydroxybenzoic acid, and any combination thereof.

The hydroxynaphthoic acid may be selected from the group consisting of 6-hydroxy-2-naphthoic acid, 3-hydroxy-2-naphthoic acid, 2-hydroxy-1-naphthoic acid, 1-hydroxy-2-naphthoic acid, and any combination thereof.

The wholly aromatic liquid crystalline polyester resin may include 70 to 80 parts by mol of the repeating unit derived from the hydroxybenzoic acid and 20 to 30 parts by mol of the repeating unit derived from the hydroxynaphthoic acid.

The white inorganic filler may include titanium oxide.

The amount of the white inorganic filler may be in the range of 10 to 60 parts by weight based on 100 parts by weight of the wholly aromatic liquid crystalline polyester resin compound.

The wholly aromatic liquid crystalline polyester resin compound may further include at least one of a glass fiber and wollastonite.

According to another aspect of the present invention, there is provided a light-emitting device including the reflector.

The light-emitting device may be a light emitting diode (LED).

Advantageous Effects of Invention

According to the an embodiment of the present invention, since the reflector includes the wholly aromatic liquid crystalline polyester resin compound that includes the repeating unit derived from the hydroxybenzoic acid and the repeating unit derived from the hydroxynaphthoic acid, but does not include a repeating unit derived from an aromatic dicarboxylic acid, the reflector has high whiteness, initial reflectance of the reflector is less reduced, and discoloration of the reflector caused by light and heat may be prevented.

According to another embodiment of the present invention, a light-emitting device including the reflector may have a high emission capability and a long lifespan.

MODE FOR THE INVENTION

Figure 1:
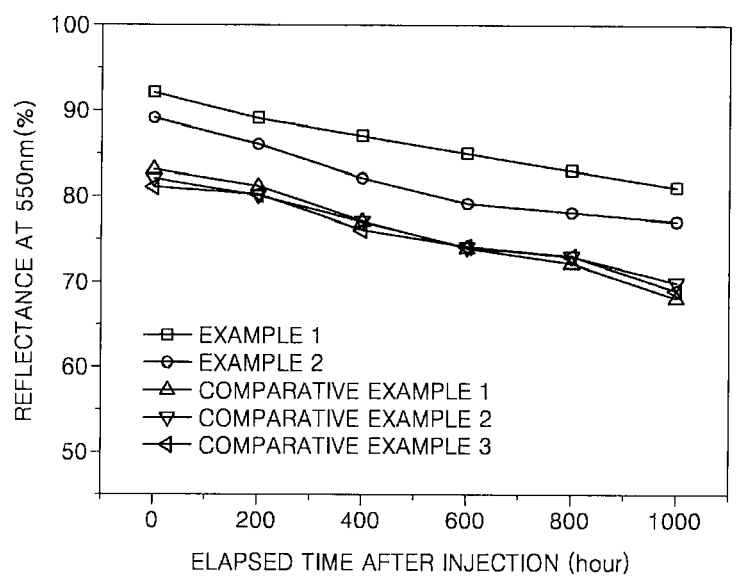
FIG. 1 is a graph illustrating evaluation results of anti-discoloration property of reflectors for LEDs each prepared according to Examples 1 and 2 and Comparative Examples 1 to 3.

Hereinafter, exemplary embodiments of the present invention will be described in detail with reference to the accompanying drawing.

As used herein, the term "and/or" includes any and all combinations of one or more of the associated listed items. Expressions such as "at least one of," when preceding a list of elements, modify the entire list of elements and do not modify the individual elements of the list.

A reflector according to an embodiment of the present invention will be described.

The reflector used herein refers to an object that adjusts the brightness of light emitted from a light-emitting device such as a light emitting diode (LED) by using reflection of light.

The reflector includes a wholly aromatic liquid crystalline polyester resin compound that includes a repeating unit derived from a hydroxybenzoic acid and a repeating unit derived from a hydroxynaphthoic acid, but does not include a repeating unit derived from an aromatic dicarboxylic acid.

The wholly aromatic liquid crystalline polyester resin compound does not discolor even when exposed to light and heat for a long period of time due to the intrinsic properties of the wholly aromatic liquid crystalline polyester resin that is a main ingredient of the wholly aromatic liquid crystalline polyester resin compound, so that a reflector including the wholly aromatic liquid crystalline polyester resin compound has high whiteness and excellent durability. In addition, the initial reflectance decline of the reflector including the wholly aromatic liquid crystalline polyester resin compound is reduced. In addition, an emission capability of the light-emitting device including the reflector lasts for a long period of time, and thus, the lifespan of the light-emitting device increases.

The wholly aromatic liquid crystalline polyester resin may include 70 to 80 parts by mol of the repeating unit derived from the hydroxybenzoic acid and 20 to 30 parts by mol of the repeating unit derived from the hydroxynaphthoic acid. If the amounts of the repeating unit derived from the hydroxybenzoic acid and the repeating unit derived from the hydroxynaphthoic acid are within the ranges described above, the wholly aromatic liquid crystalline polyester resin may be efficiently prepared and may have sufficient whiteness for the reflector, high anti-discoloration property at a high temperature, and high physical strength. In addition, a compound including the wholly aromatic liquid crystalline polyester resin may be efficiently used in injection molding since it is not well released, does not break well, and dust is not well generated therefrom during the injection molding.

The wholly aromatic liquid crystalline polyester resin used in the preparation of the wholly aromatic liquid crystalline polyester resin compound may be prepared according to the following steps:

(a) Synthesizing a wholly aromatic liquid crystalline polyester prepolymer by condensation polymerizing at least one monomer; and (b) Synthesizing a wholly aromatic liquid crystalline polyester resin by solid phase condensation polymerizing the prepolymer.

The monomer used in step (a) includes: hydroxybenzoic acid selected from the group consisting of p-hydroxybenzoic acid, 3-hydroxybenzoic acid, 2-hydroxybenzoic acid, and any combination thereof; and hydroxynaphthoic acid selected from the group consisting of 6-hydroxy-2-naphthoic acid, 3-hydroxy-2-naphthoic acid, 2-hydroxy-1-naphthoic acid, 1-hydroxy-2-naphthoic acid and any combination thereof, but does not include aromatic dicarboxylic acid such as isophthalic acid, 2,6-naphthalene dicarboxylic acid, terephthalic acid, and phthalic acid. The monomer used in step (a) may further include aromatic diol, aromatic diamine, aromatic hydroxylamine, and/or aromatic amino carboxylic acid.

In addition, metal acetate may further be used as a catalyst that stimulates the synthesis of the wholly aromatic liquid crystalline polyester prepolymer. The metal acetate may include at least one selected from the group consisting of magnesium acetate, potassium acetate, calcium acetate, zinc acetate, manganese acetate, lead acetate, antimony acetate, and cobalt acetate. The amount of the metal acetate may be 0.10 parts by weight or less based on 100 parts by weight of the monomer.

The synthesis of step (a) may be performed using solution condensation polymerization or bulk condensation polymerization. In addition, a monomer (i.e., acylated monomer) that has reactivity enhanced by pre-treatment with chemicals such as an acylating agent (particularly, acetylating agent) may be used in step (a) in order to expedite the condensation polymerization.

For the solid phase condensation polymerization in step (b), the prepolymer is required to be heated using, for example, a heating plate, hot air, hot fluid, or the like. By-products produced during the solid phase condensation polymerization may be removed by purging the reactor with inert gas or by applying vacuum thereto.

In addition, the wholly aromatic liquid crystalline polyester resin may include a variety of repeating units in the chain thereof. For example, the repeating units are as follows.

(1) Repeating unit derived from aromatic hydroxycarboxylic acid:

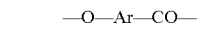

(2) Repeating unit derived from aromatic diol:

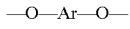

(3) Repeating unit derived from aromatic diamine:

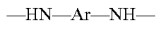

(4) Repeating unit derived from aromatic hydroxylamine:

(5) Repeating unit derived from aromatic amino carboxylic acid:

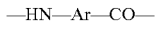

In the formulae defined above, Ar may be phenylene, biphenylene, naphthalene, an aromatic compound in which two phenylenes are bonded to each other via a carbon or non-carbon element, or an aromatic compound selected from the group consisting of phenylene, biphenylene, naphthalene, or two phenylenes bonded to each other via a carbon or non-carbon element in which at least one hydrogen atom is substituted with other elements.

The wholly aromatic liquid crystalline polyester resin compound may further include a white inorganic filler as an additive. The wholly aromatic liquid crystalline polyester resin compound may further include a glass fiber and/or wollastonite. The white inorganic filler improves whiteness of the wholly aromatic liquid crystalline polyester resin compound, so that the reflectance of the reflector including the resin compound may be increased. In addition, the glass fiber improves the mechanical strength of the reflector including the wholly aromatic liquid crystalline polyester resin compound without reducing the reflectance of the reflector. The wollastonite prevents surface roughness of the resin compound, which may increase due to the glass fiber, from being increased and also prevents the adhesive property of the resin compound, which may decrease due to the glass fiber, from being reduced.

The white inorganic filler may include titanium oxide, for example, titanium dioxide. In addition, the white inorganic filler may include a silica-based compound, e.g., $SiO_2$ and/or an alumina-based compound, e.g., $Al_2O_3$, and thus having dispersibility, durability, and anti-oxidation property. In addition, the titanium oxide may be surface-treated with a hydrophilic organic compound or a hydrophobic organic compound for improving adhesion property with the resin in the resin compound including the titanium oxide.

In addition, the amount of the white inorganic filler may be in the range of 10 to 60 parts by weight, for example, 30 to 60 parts by weight, based on 100 parts by weight of the wholly aromatic liquid crystalline polyester resin compound. If the amount of the white inorganic filler is in the range of 10 to 60 parts by weight based on 100 parts by weight of the wholly aromatic liquid crystalline polyester resin compound, an injection-molded product that has high whiteness, tensile strength, and flexural strength may be manufactured.

The amount of the glass fiber may be in the range of 5 to 50 parts by weight based on 100 parts by weight of the wholly aromatic liquid crystalline polyester resin compound. If the amount of the glass fiber is within the range described above, injection-molded products have sufficient self supporting force, so that the yield of the resin compound increases, injection-molded products have suitable elasticity, so that the injection-molded products do not break, and the glass fiber is uniformly dispersed in injection-molded products, so that the injection-molded products are efficiently manufactured and have uniform strength.

The amount of the wollastonite may be in the range of 5 to 40 parts by weight based on 100 parts by weight of the wholly aromatic liquid crystalline polyester resin compound. If the amount of the wollastonite is within the range described above, injection-molded products have low surface roughness, high strength, and sufficient self supporting force, so that the yield of the resin compound increases.

The wholly aromatic liquid crystalline polyester resin compound may be prepared by mixing the wholly aromatic liquid crystalline polyester resin, the white inorganic filler, and optionally the glass fiber and/or wollastonite in a predetermined ratio, and melt-kneading and drying the mixture. In the melt-kneading, a batch kneader, a twin-screw extruder, or a mixing roll may be used. In addition, a lubricant, such as a fluoro-based lubricant, may be used during the melt-kneading for smooth melt-kneading.

The wholly aromatic liquid crystalline polyester resin compound may be injection-molded into reflectors having various shapes such as a circle, a plate, a cup, or a lampshade having a thickness in the range of 0.1 to 100 mm using a pressure or speed control type injection molding machine. During the injection molding, the wholly aromatic liquid crystalline polyester resin compound is insert injection-molded into a frame or sole injection-molded. The reflector prepared according to the above process may be used in a light-emitting device such as an LED.

Hereinafter, one or more embodiments will be described in detail with reference to the following examples. However, these examples are not intended to limit the purpose and scope of the invention.

EXAMPLES

Preparation Example 1-1

Preparation of Wholly Aromatic Liquid Crystalline Polyester Resin 1

3.018 kg of p-hydroxybenzoic acid, 1.300 kg of 6-hydroxy-2-naphthoic acid, and 0.3 g of potassium acetate, as a catalyst, were added to a 10 L batch reactor, the temperature of which is controllable. Nitrogen gas was injected to the reactor to inactivate the inside of the reactor, and then 3.024 kg of acetic anhydride was added thereto. Then, the temperature of the reactor was increased up to 150° C. for 30 minutes and the hydroxy group of the monomers was acetylated at 150° C. for 2 hours. Then, the temperature of the reactor was increased up to 320° C. for 5 hours and 20 minutes while removing acetic acid that is produced during the acetylation and maintained at this temperature for 20 minutes to prepare a wholly aromatic liquid crystalline polyester prepolymer 1 by condensation polymerization of the monomers. Acetic acid, which is a by-product of the preparation of the wholly aromatic liquid crystalline polyester prepolymer 1, was also continuously removed during the preparation of the wholly aromatic liquid crystalline polyester prepolymer 1 with the acetic acid produced during the acetylation. Then, the wholly aromatic liquid crystalline polyester prepolymer 1 was collected from the reactor and cooled and solidified.

Then, the wholly aromatic liquid crystalline polyester prepolymer 1 was ground to have an average particle diameter of 1 mm, and 3 kg of the ground wholly aromatic liquid crystalline polyester prepolymer 1 was added to a 10 L rotary kiln reactor. The temperature of the reactor was increased up to 200° C. where weight loss is initiated for 1 hour while flowing nitrogen at a rate of 1 $Nm^3$/hr. Then, the temperature was increased up to 290° C. for 6 hours and maintained at the same temperature for 5 hours to prepare a wholly aromatic liquid crystalline polyester resin 1. Then, the reactor was cooled to room temperature for 1 hour, and the wholly aromatic liquid crystalline polyester resin 1 was collected from the reactor.

Preparation Example 1-2

Preparation of Wholly Aromatic Liquid Crystalline Polyester Resin 2

6.214 kg of p-hydroxybenzoic acid, 1.422 kg of terephthalic acid, and 1.121 kg of isophthalic acid were added to a 10 L batch reactor, the temperature of which is controllable. Nitrogen gas was injected to the reactor to inactivate the inside of the reactor, and then 3.190 kg of acetic anhydride was added thereto. Then, the temperature of the reactor was increased up to 150° C. for 30 minutes and the hydroxy group of the monomers was acetylated at 150° C. for 3 hours. Then, the temperature of the reactor was increased up to 330° C. for 6 hours while removing acetic acid that is produced during the acetylation to perform condensation polymerization of the monomers, resulting in preparing a wholly aromatic liquid crystalline polyester prepolymer 2. Acetic acid, which is a by-product of the preparation of the prepolymer 2, was also removed during the preparation of the wholly aromatic liquid crystalline polyester prepolymer 2 with the acetic acid produced during the acetylation. Then, the wholly aromatic liquid crystalline polyester prepolymer 2 was collected from the reactor and cooled and solidified.

Then, the wholly aromatic liquid crystalline polyester prepolymer 2 was ground to have an average particle diameter of 1 mm, and 2 kg of the ground wholly aromatic liquid crystalline polyester prepolymer 2 was added to a 10 L rotary kiln reactor. The temperature of the reactor was increased up to 200° C. where weight loss is initiated for 1 hour while flowing nitrogen at a rate of 1 $Nm^3$/hr. Then, the temperature was increased up to 320° C. for 10 hours and maintained at the same temperature for 3 hours to prepare a wholly aromatic liquid crystalline polyester resin 2. Then, the reactor was cooled to room temperature for 1 hour, and the wholly aromatic liquid crystalline polyester resin 2 was collected from the reactor.

Preparation Example 2-1

Preparation of Wholly Aromatic Liquid Crystalline Polyester Resin Compound 1

The wholly aromatic liquid crystalline polyester resin 1 prepared in Preparation Example 1-1, a glass fiber (Sungjin Fiber Co., Ltd, MF150 W-AC) having a length in the range of 100 to 300 μm, an average length of 150 μm, and a diameter of 10±1 μm, and titanium oxide (Dupont, T-Pure R-105)

coated with UV-stable alumina, silica, and a hydrophobic organic compound were mixed in a weight ratio of 5:1:4 using a batch type mixing unit (Jeil Industry Device Co., Ltd.) for 30 minutes. Then, the mixture was dried in an oven drier (A Sung Plant) at 130° C. for 4 hours or more to reduce its moisture content to 200 wtppm or less and melt-kneaded while quantitatively feeding at a rate of 10 kg/hr using a twin extruder (L/D: 40, diameter: 25 mm) to prepare a wholly aromatic liquid crystalline polyester resin compound 1. In order to remove gas and by-products produced during the melt-kneading, one open vent unit and one vacuum vent unit were respectively installed at No. 3 and No. 7 barrel units of the twin extruder. The prepared wholly aromatic liquid crystalline polyester resin compound 1 was cooled using a cooling system (Seawon M-tech Co., Ltd., mesh conveyer belt), moisture was removed, and the resultant was pelletized. Then, the prepared pellets of the wholly aromatic liquid crystalline polyester resin compound 1 were dried using an automatic drier (Jeil Industry Device Co., Ltd.) for 2 hours and mixed.

Preparation Example 2-2

Preparation of Wholly Aromatic Liquid Crystalline Polyester Resin Compound 2

A wholly aromatic liquid crystalline polyester resin compound 2 was prepared in the same manner as in Preparation Example 2-1, except that the weight ratio of the wholly aromatic liquid crystalline polyester resin 1, the glass fiber, and the titanium oxide was 6:1:3.

Preparation Example 2-3

Preparation of Wholly Aromatic Liquid Crystalline Polyester Resin Compound 3

A wholly aromatic liquid crystalline polyester resin compound 3 was prepared in the same manner as in Preparation Example 2-1, except that the wholly aromatic liquid crystalline polyester resin 2 prepared in Preparation Example 1-2 was used instead of the wholly aromatic liquid crystalline polyester resin 1.

Preparation Example 3

Preparation of Polyamide-based Resin Compound

A polyamide-based resin compound was prepared in the same manner as in Preparation Example 2-1, except that a polyamide-based resin (Solvay, Amodel WH118(PA6T/66)) was used instead of the wholly aromatic liquid crystalline polyester resin 1.

Examples 1 and 2

Preparation of Reflectors 1 and 2 for LED

The wholly aromatic liquid crystalline polyester resin compounds each prepared according to Preparation Examples 2-1 and 2-2 were dried using an oven drier (A Sung Plant) at 130° C. for 4 hours or more to reduce a moisture content thereof to 200 wtppm or less. Then, planar reflectors 1 and 2 having a thickness of 2 mm, a width of 50 mm, and a length of 50 mm were respectively prepared using a motor drive injection molding machine (Sodick, TR30EH2). In this case, the inside of the injection molding machine was cleaned by 200 injections, and 100 samples of each reflector were collected.

Comparative Example 1

Preparation of Reflector 3 for LED

A reflector 3 for an LED was prepared in the same manner as in Examples 1 and 2, except that the wholly aromatic liquid crystalline polyester resin compound prepared in Preparation Examples 2-3 was used instead of the wholly aromatic liquid crystalline polyester resin compounds each prepared in Preparation Examples 2-1 to 2-2.

Comparative Example 2

Preparation of Reflector 4 for LED

A reflector 4 for an LED was prepared in the same manner as in Examples 1 and 2, except that the polyamide-based resin compound prepared in Preparation Example 3 was used instead of the wholly aromatic liquid crystalline polyester resin compounds each prepared in Preparation Examples 2-1 to 2-2.

Comparative Example 3

Preparation of Reflector 5 for LED

A reflector 5 for an LED was prepared in the same manner as in Examples 1 and 2, except that a resin compound (Nippon Oil Corporation, NW 0722 grade, Xydar) was used instead of the wholly aromatic liquid crystalline polyester resin compounds each prepared in Preparation Examples 2-1 to 2-2.

Evaluation Example

Evaluation of Performances of Reflectors 1 to 5 for LEDs

Anti-discoloration property and the effect of improving initial reflectance decline of the reflectors 1 to 5 for LEDs each prepared according to Examples 1 and 2 and Comparative Examples 1 to 3 were evaluated.

(Anti-Discoloration Property)

Reflectance of each reflector was measured right after injection molding using a color difference meter (Konica Minolta, CM-3700d). Afterwards, the reflector was added to an oven drier (A Sung Plant) maintained at 200° C. and reflectance of each reflector was measured for 1,000 hours at every 200 hours to evaluate anti-discoloration property. As the reflectance is less changed with time, anti-discoloration property increases. That is, reflectivities of 100 samples of each reflector for an LED were measured in a wavelength range of 360 to 740 nm at every 10 nm interval using the color difference meter, and an average value thereof was calculated and the average value at 550 nm at which a standard reflectance is measured was indicated as reflectance. Here, the measurement range of reflectance ranged from 0 to 100%, and a standard deviation of the reflectance was 0.05% or less. Evaluation results of the anti-discoloration property are shown in Table 1 and FIG. 1.

TABLE 1

| Time period after injection molding (hr) | Reflectance (%) | | | | |
| --- | --- | --- | --- | --- | --- |
| | Example 1 | Example 2 | Comparative Example 1 | Comparative Example 2 | Comparative Example 3 |
| 0 | 92 | 89 | 83 | 82 | 81 |
| 200 | 89 | 86 | 81 | 80 | 80 |
| 400 | 87 | 82 | 77 | 77 | 76 |
| 600 | 85 | 79 | 74 | 74 | 74 |
| 800 | 83 | 78 | 72 | 73 | 73 |
| 1000 | 81 | 77 | 68 | 70 | 69 |

Referring to Table 1 and FIG. 1, the initial reflectance and anti-discoloration properties of the reflectors for LEDs each prepared according to Examples 1 and 2 were better than those of the reflectors for LEDs each prepared according to Comparative Examples 1 to 3.

(Effect of Improving the Initial Reflectance Decline)

Reflectance of each reflector was measured right after injection molding using a color difference meter (Konica Minolta, CM-3700d). Samples of each reflector were added to a sealed space in which a xenon lamp having a rated output of 50 W, a maximum luminous flux of 5,000 lumen, and a color temperature of 4,300K (Polarion, PS-PH) was installed, the reflectance of each reflector was measured for 200 hours at every 20 hours to evaluate the effect of improving the initial reflectance decline. As the reflectance is less changed with time, the effect of improving the initial reflectance increases. That is, reflectivities of 100 samples of each reflector for an LED were measured in a wavelength ranging from 360 to 740 nm at every 10 nm interval using the color difference meter, and an average value thereof was calculated and the average value at 550 nm at which a standard reflectance is measured was indicated as reflectance. Here, the measurement range of reflectance ranged from 0 to 100%, and a standard deviation of the reflectance was 0.1% or less. Evaluation results of the effect of improving the initial reflectance decline are shown in Table 2 and FIG. 2.

TABLE 2

| Exposure time to Xenon lamp (hr) | Reflectance (%) | | | | |
| --- | --- | --- | --- | --- | --- |
| | Example 1 | Example 2 | Comparative Example 1 | Comparative Example 2 | Comparative Example 3 |
| 0 | 92 | 89 | 83 | 82 | 81 |
| 20 | 92 | 89 | 80 | 79 | 80 |
| 40 | 92 | 88 | 81 | 78 | 79 |
| 60 | 91 | 89 | 75 | 72 | 73 |
| 80 | 92 | 89 | 72 | 71 | 70 |
| 100 | 92 | 89 | 69 | 70 | 68 |
| 120 | 91 | 89 | 72 | 71 | 67 |
| 140 | 91 | 89 | 74 | 73 | 66 |
| 160 | 91 | 88 | 78 | 75 | 72 |
| 180 | 91 | 88 | 79 | 78 | 75 |
| 200 | 91 | 88 | 80 | 78 | 78 |

Figure 2:
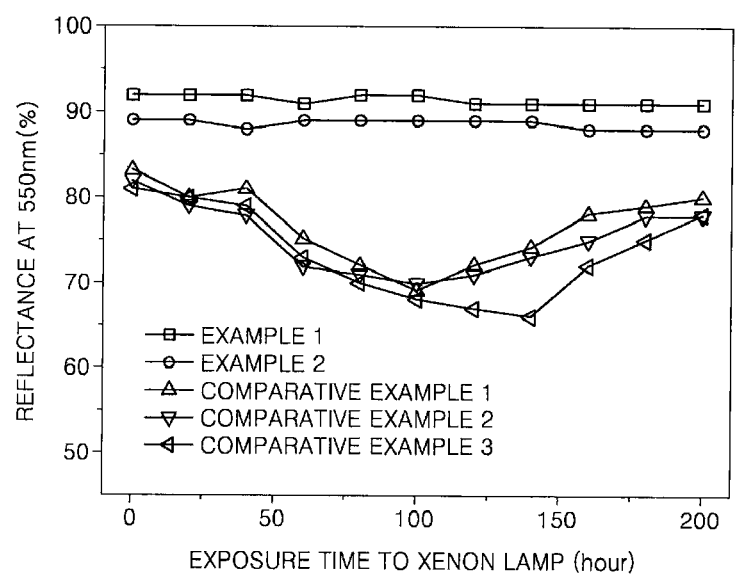
FIG. 2 is a graph illustrating evaluation results of the effects of improving initial reflectance decline of reflectors for LEDs each prepared according to Examples 1 and 2 and Comparative Examples 1 to 3.

Referring to Table 2 and FIG. 2, the effects of improving the initial reflectivities of the reflectors for LEDs each prepared according to Examples 1 and 2 were higher than those of the reflectors for LEDs each prepared according to Comparative Examples 1 to 3.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A reflector comprising:
a wholly aromatic liquid crystalline polyester resin compound that comprises a repeating unit derived from a hydroxybenzoic acid and a repeating unit derived from a hydroxynaphthoic acid, but does not comprise a repeating unit derived from an aromatic dicarboxylic acid,
wherein the wholly aromatic liquid crystalline polyester resin compound further comprises a white inorganic filler,
wherein the wholly aromatic liquid crystalline polyester resin comprises 70 to 80 parts by mol of the repeating unit derived from the hydroxybenzoic acid and 20 to 30 parts by mol of the repeating unit derived from the hydroxynaphthoic acid,
wherein the amount of the white inorganic filler is in the range of 10 to 60 parts by weight based on 100 parts by weight of the wholly aromatic liquid crystalline polyester resin compound,
wherein the reflector has the initial reflectance decline of 1% or less, as measured when the reflector is exposed to a xenon lamp having a rated output of 50 W, a maximum luminous flux of 5,000 lumen, and a color temperature of 4,300K.

2. The reflector of claim 1, wherein the hydroxybenzoic acid comprises one selected from the group consisting of p-hydroxybenzoic acid, 3-hydroxybenzoic acid, 2-hydroxybenzoic acid, and any combination thereof.

3. The reflector of claim 1, wherein the hydroxynaphthoic acid is selected from the group consisting of 6-hydroxy-2-naphthoic acid, 3-hydroxy-2-naphthoic acid, 2-hydroxy-1-naphthoic acid, 1-hydroxy-2-naphthoic acid, and any combination thereof.

4. The reflector of claim 1, wherein the white inorganic filler comprises titanium oxide.

5. The reflector of claim 4, wherein the wholly aromatic liquid crystalline polyester resin compound further comprises at least one of a glass fiber and wollastonite.

6. A light-emitting device comprising a reflector according to claim 1.

7. The light-emitting device of claim 6, wherein the light-emitting device is a light emitting diode (LED).

* * * * *